(12) United States Patent
Chang et al.

(10) Patent No.: US 12,103,845 B2
(45) Date of Patent: Oct. 1, 2024

(54) MICRO-ELECTROMECHANICAL SYSTEM AND METHOD FOR FABRICATING MEMS HAVING PROTECTION WALL

(71) Applicant: UNITED MICROELECTRONICS CORP., Hsinchu (TW)

(72) Inventors: Jung-Hao Chang, Taoyuan (TW); Weng-Yi Chen, Hsinchu County (TW)

(73) Assignee: UNITED MICROELECTRONICS CORP., Hsinchu (TW)

( * ) Notice: Subject to any disclaimer, the term of this patent is extended or adjusted under 35 U.S.C. 154(b) by 478 days.

(21) Appl. No.: 17/075,737

(22) Filed: Oct. 21, 2020

(65) Prior Publication Data

US 2022/0119248 A1    Apr. 21, 2022

(51) Int. Cl.
| | | |
|---|---|---|
| B81C 1/00 | (2006.01) | |
| B81B 7/00 | (2006.01) | |
| H04R 7/06 | (2006.01) | |
| H04R 19/04 | (2006.01) | |
| H04R 31/00 | (2006.01) | |

(52) U.S. Cl.
CPC ........ *B81C 1/00801* (2013.01); *B81B 7/0025* (2013.01); *H04R 7/06* (2013.01); *H04R 19/04* (2013.01); *H04R 31/003* (2013.01); *B81B 2201/0257* (2013.01); *B81B 2203/0127* (2013.01); *B81B 2203/0353* (2013.01); *H04R 2201/003* (2013.01)

(58) Field of Classification Search
CPC ... B81B 7/0009–0029; B81B 2207/115; B81B 2201/0257; B81B 2203/0127; B81B 2203/0353; B81B 2203/0315; B81C 1/00777–00833; H04R 7/06; H04R 19/04; H04R 31/003; H04R 2201/003; H04R 19/005
See application file for complete search history.

(56) References Cited

U.S. PATENT DOCUMENTS

| | | |
|---|---|---|
| 5,242,863 A | 9/1993 | Xiang-Zheng et al. |
| 5,531,121 A | 7/1996 | Sparks et al. |
| 8,723,276 B2 | 5/2014 | Binder et al. |
| 8,936,960 B1 | 1/2015 | Wang et al. |
| 9,006,105 B2 | 4/2015 | Lu et al. |
| 9,107,017 B1 | 8/2015 | Chiu et al. |
| 9,499,399 B2 | 11/2016 | Chen et al. |
| 9,663,354 B2 | 5/2017 | Bieselt et al. |
| 9,728,567 B2 | 8/2017 | Shiu et al. |
| 10,676,349 B1 | 6/2020 | Grosjean et al. |
| 2013/0062737 A1* | 3/2013 | Hongo .......... H01L 27/1464 257/E29.022 |
| 2015/0004732 A1* | 1/2015 | Lan ............... B81C 1/00801 438/50 |
| 2017/0107097 A1* | 4/2017 | Cheng .......... B81C 1/00301 |
| 2017/0210615 A1* | 7/2017 | Lin ............... H04R 19/04 |

* cited by examiner

*Primary Examiner* — Shahed Ahmed
*Assistant Examiner* — Sun Mi Kim King
(74) *Attorney, Agent, or Firm* — WPAT, P.C (57) ABSTRACT

A micro electromechanical system (MEMS) includes a substrate, a semiconductor device and a protection wall. The substrate has a surface. The semiconductor device is disposed on the surface. The protection wall has a poly-silicon layer surrounding the semiconductor device and connecting to the surface.

20 Claims, 9 Drawing Sheets

MICRO-ELECTROMECHANICAL SYSTEM AND METHOD FOR FABRICATING MEMS HAVING PROTECTION WALL

BACKGROUND

Technical Field

The disclosure relates to a semiconductor device and the method for fabricating the same, and more particularly to a micro-electromechanical system (MEMS) and the method for fabricating the same.

Description of Background

A MEMS, such as a micro-acoustical sensor, a gyro-sensor, an accelerometer, a gas sensor, a clock generation or an oscillator, with advantages of small size, low power consumption, better suppression of interference to the surrounding environment, and the capability for forming by using automatic surface-mount technology (SMT) have been widely used in portable electric products, such as mobile phones and notebook computers, MP3 players and personal digital assistants (PDAs).

A MEMS typically includes a semiconductor device (to take a MEMS microphone as an example) formed among several semiconductor layers, and the process for forming the semiconductor device (the MEMS microphone) includes steps for removing semiconductor layers to form gaps or chambers for accommodating mechanical actuation elements (such as the membrane of the MEMS microphone). In order to remain the structure stability of the MEMS microphone during the process, it is necessary to form a vertical protection wall extending into the semiconductor layers and wrapping the MEMS microphone to prevent it from been damaged by etchant for removing the portions of the semiconductor layers.

However, the protection wall traditionally is made of metal that is poor for wrapping a stair structure. When the trench used to form the protection wall has a stair structure with a height difference greater than 5 μm, the protection wall may not cover the sidewall of the trench properly at the corner of the stair structure. Such that, the etchant may penetrate into there from to damage the semiconductor device (the MEMS microphone), and the reliability and performance of the MEMS thus may be deteriorated.

Therefore, there is a need of providing an improved MES and method for fabricating the same to obviate the drawbacks encountered from the prior art.

SUMMARY

One aspect of the present disclosure is to provide a micro electromechanical system (MEMS) includes a substrate, a semiconductor device and a protection wall. The substrate has a surface. The semiconductor device is disposed on the surface. The protection wall has a poly-silicon layer surrounding the semiconductor device and connecting to the surface.

Another aspect of the present disclosure is to provide a method for fabricating a MEMS, wherein the method includes steps as follows: A substrate having a surface is firstly provided. A semiconductor device is formed on the surface. A protection wall having a poly-silicon layer is formed to make the poly-silicon layer surrounding the semiconductor device and connecting to the surface of the substrate.

In accordance with the embodiments of the present disclosure, a MEMS and the method for performing the same are provided. The MEMS includes a protection wall having a poly-silicon layer that surrounds a semiconductor device formed in several semiconductor layers. By the support of the protection wall, the structure of the semiconductor device can be kept stable during the etching process of removing portions of the semiconductor layers to form gaps or chambers for accommodating mechanical actuation elements of the semiconductor device. Meanwhile, the poly-silicon layer of the protection wall can properly wrap the semiconductor device to protect it from being damaged by the etching process. Such that, the reliability and performance of the MEMS can be improved.

BRIEF DESCRIPTION OF THE DRAWINGS

The above objects and advantages of the present disclosure will become more readily apparent to those ordinarily skilled in the art after reviewing the following detailed description and accompanying drawings, in which.

DETAILED DESCRIPTION

The embodiments as illustrated below provide a MEMS and the method for performing the same, which can achieve the purpose of improving the reliability and performance of the MEMS. The present disclosure will now be described more specifically with reference to the following embodiments illustrating the structure and arrangements thereof.

It is to be noted that the following descriptions of preferred embodiments of this disclosure are presented herein for purpose of illustration and description only. It is not intended to be exhaustive or to be limited to the precise form disclosed. Also, it is important to point out that there may be other features, elements, steps, and parameters for implementing the embodiments of the present disclosure which are not specifically illustrated. Thus, the descriptions and the drawings are to be regard as an illustrative sense rather than a restrictive sense. Various modifications and similar arrangements may be provided by the persons skilled in the art within the spirit and scope of the present disclosure. In addition, the illustrations may not be necessarily drawn to scale, and the identical elements of the embodiments are designated with the same reference numerals.

FIGS. 1A to 1F are cross-sectional views illustrating a series of the processing structure for fabricating a MEMS 10 according to one embodiment of the present disclosure. In some embodiments of the present disclosure, the MEMS 10 may be (but not limited to) a micro-acoustical sensor, a gyro-sensor, an accelerometer, a gas sensor, a clock generation or an oscillator. In the present embodiment, the MEMS 10 can be a micro-acoustical sensor including a MEMS microphone (semiconductor device 100).

The method for fabricating a MEMS 10 includes major process as follows: A substrate 101 having a surface 101a is firstly provided; a semiconductor device 100 is formed on the surface; and a protection wall 110 having a poly-silicon layer 110a is formed to make the poly-silicon layer 110a surrounding the semiconductor device 100 and connecting to the surface 101a of the substrate 101. In some embodiments of the present disclosure, the processing steps for forming the semiconductor device 100 and that for forming the protection wall 110 can be performed interlacedly.

In some embodiments of the present disclosure, the substrate 101 can be a semiconductor substrate, such as a silicon (Si) substrate, a germanium (Ge) substrate or a combination thereof. A dielectric layer 102 is formed on the surface 101a of the substrate 101, and a membrane 103 embedded in the dielectric layer 102 is then formed (see FIG. 1A).

Figure 1A:
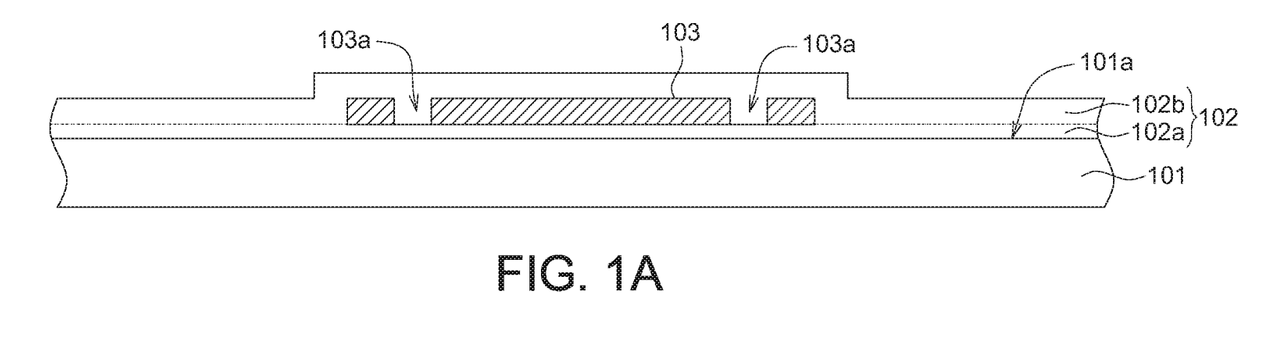
FIGS. 1A to 1F are cross-sectional views illustrating a series of the processing structure for fabricating a MEMS according to one embodiment of the present disclosure.

The dielectric layer 102 can be a composite layer formed by a plurality of fabrication steps, and the processing steps for forming the dielectric layer 102 and the processing steps for forming the membrane 103 can be also performed interlacedly, as follows:

Firstly, a first dielectric material layer 102a is formed on a surface 101a of the substrate 101 by a deposition or coating process. The membrane 103 is then formed on the first dielectric material layer 102a. In some embodiments of the present disclosure, the first dielectric material layer 102a may be made of a dielectric material, such as silicon oxide (SiOx), silicon carbide (SiC), silicon oxycarbide (SiCO), silicon nitride (SiN), silicon oxynitride (SiNO), the arbitrary combinations thereof or other suitable dielectric material. In the present embodiment, the first dielectric material layer 102a may be a silicon dioxide ($SiO_2$) film.

The forming of the membrane 103 includes steps as follows: A conductive material layer (not shown) is formed over the first dielectric material layer 102a by a coating or deposition process. The conductive material layer is then patterned by a photolithography etching process to form a plurality of vent holes 103a or slits (not shown) penetrating the conductive material layer. The membrane 103 can be made of a conductive material, for example, a metal (including, but not limited to, gold (G), silver (Ag), copper (Cu), aluminum (Al) or the arbitrary alloys thereof), a doped semiconductor material (including doped poly-silicon or other suitable material), a metal oxide (including Indium Tin Oxide (ITO) or other suitable material) or a combination thereof. In the present embodiment, the membrane 103 can be a copper film. The vent holes 103a may be strip-shaped slits, circular through-holes or other shaped openings passing through the membrane 103.

Next, a second dielectric material layer 102b is formed to cover the membrane 103 and the vent holes 103a, and the first dielectric material layer 102a and the second dielectric material layer 102b are combined to form the dielectric layer 102. In some embodiments of the present disclosure, the material constituting the second dielectric material layer 102b may be the same as the material constituting the first dielectric material layer 102a. In the present embodiment, the material constituting the second dielectric material layer is $SiO_2$.

There in after, a trench 104 surrounding the membrane 103, passing through the second dielectric material layer 102b and the first dielectric material layer 102a to expose a portion of the substrate 101 is formed. In some embodiments of the present disclosure, the trench 104 may be formed by a photolithography etching process, such as a dry etch process (e.g a reactive-ion etching (RIE) process). In one embodiment, the trench 104 may extend from the top surface 102c of the second dielectric material layer 102b to the surface 101a of the substrate 101 and expose the surface 101a of the substrate 101 therefrom. Alternatively, in another embodiment, the trench 104 may pass through the surface 101a and extend into the substrate 101 (see FIG. 1B). In some embodiments of the present disclosure, the trench 104 may be a ring-shaped opening thoroughly surrounding the membrane 103. In some other embodiments, the membrane 103 may be partially surrounded by the trench 104.

Figure 1B:
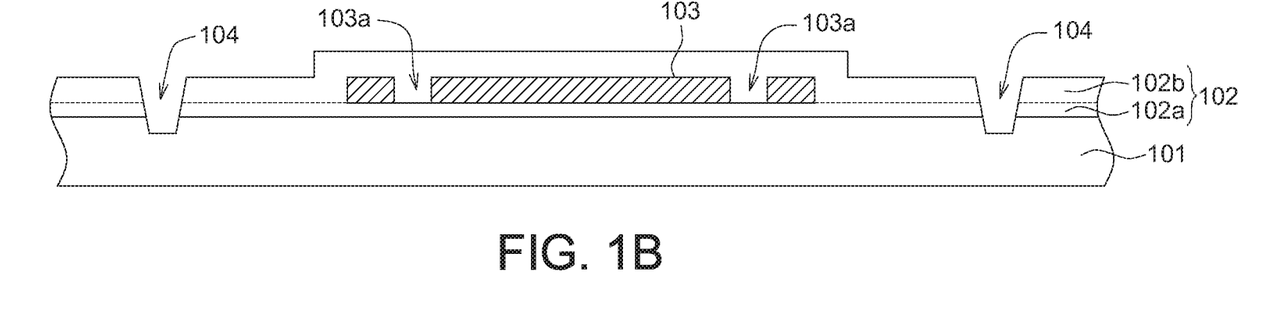
Figure 1C:
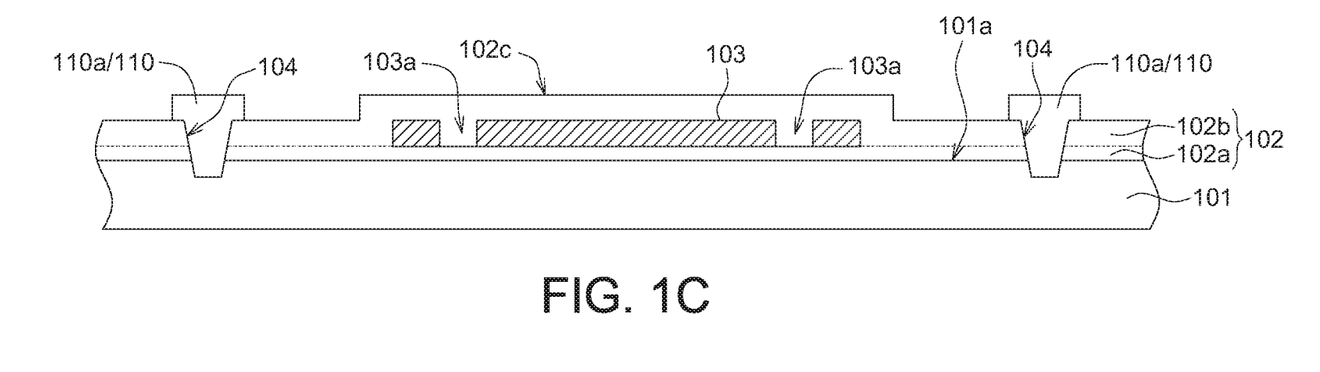

In yet other embodiments, in detailed, the trench 104 may be formed by a plurality of photolithography etching processes. Such that, the trench 104 may have a multi-stairs structure (not shown) that has at least two openings with different diameters, align with each other and respectively formed by one of the different photolithography etching processes.

Then the poly-silicon layer 110a is formed at least covering on sidewall of the trench 104. In some embodiments of the present disclosure, the poly-silicon layer 110a is formed by a deposition process, such as a chemical vapor deposition (CVD) or a physical vapor deposition (PVD) carried out on the top surface 102c of the second dielectric material layer 102b. In the present embodiment, the poly-silicon layer 110a may fully fill the trench 104 and extend beyond the top surface 102c of the second dielectric material layer 102b. Such that, a solid poly-silicon ring made by the poly-silicon layer 110a and directly in contact with the substrate 101 can be formed in the dielectric layer 102 to serve as the protection wall 110 (see FIG. 1C).

Figure 1D:
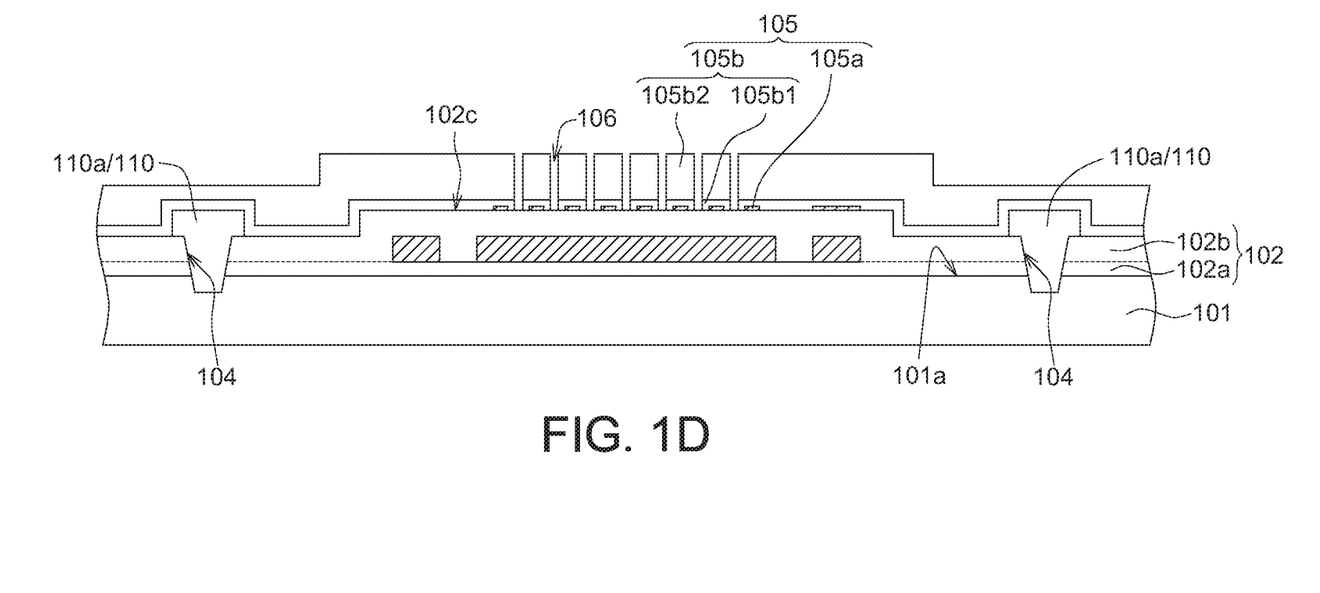

A backplate 105 is then formed on the dielectric layer 102 and the protection wall 110 (see FIG. 1D). In some embodiments of the present disclosure, the backplate 105 includes a conductive layer 105a and a dielectric protection layer 105b. The material constituting the conductive layer 105a may be the same as or different from the material constituting the membrane 103. The dielectric protection layer 105b may be a dielectric material layer, and the material constituting the dielectric protection layer 105b is different from the material constituting the dielectric layer 102. In the present embodiment, the conductive layer 105a may be a patterned copper layer, and the dielectric protection layer 105b may include a silicon nitride hard mask layer 105b1.

The forming of the backplate 105 includes steps as follows: Firstly, a conductive material layer and a dielectric material layer are formed on the dielectric layer 102 in sequence by a deposition or coating process, and a photolithography etching process, such as a dry etching process, is then performed to form a plurality of penetrating openings 106 in the conductive material layer and the dielectric material layer, so as to expose a portion of the dielectric layer 102.

In the present embodiment, the dry etching process used to pattern the conductive material layer and the dielectric material layer to form the penetrating openings 106 can be a RIE process. The dielectric protection layer 105b further includes a passive layer 105b2 made of silicon oxide covering the silicon nitride hard mask layer 105b1.

Figure 1E:
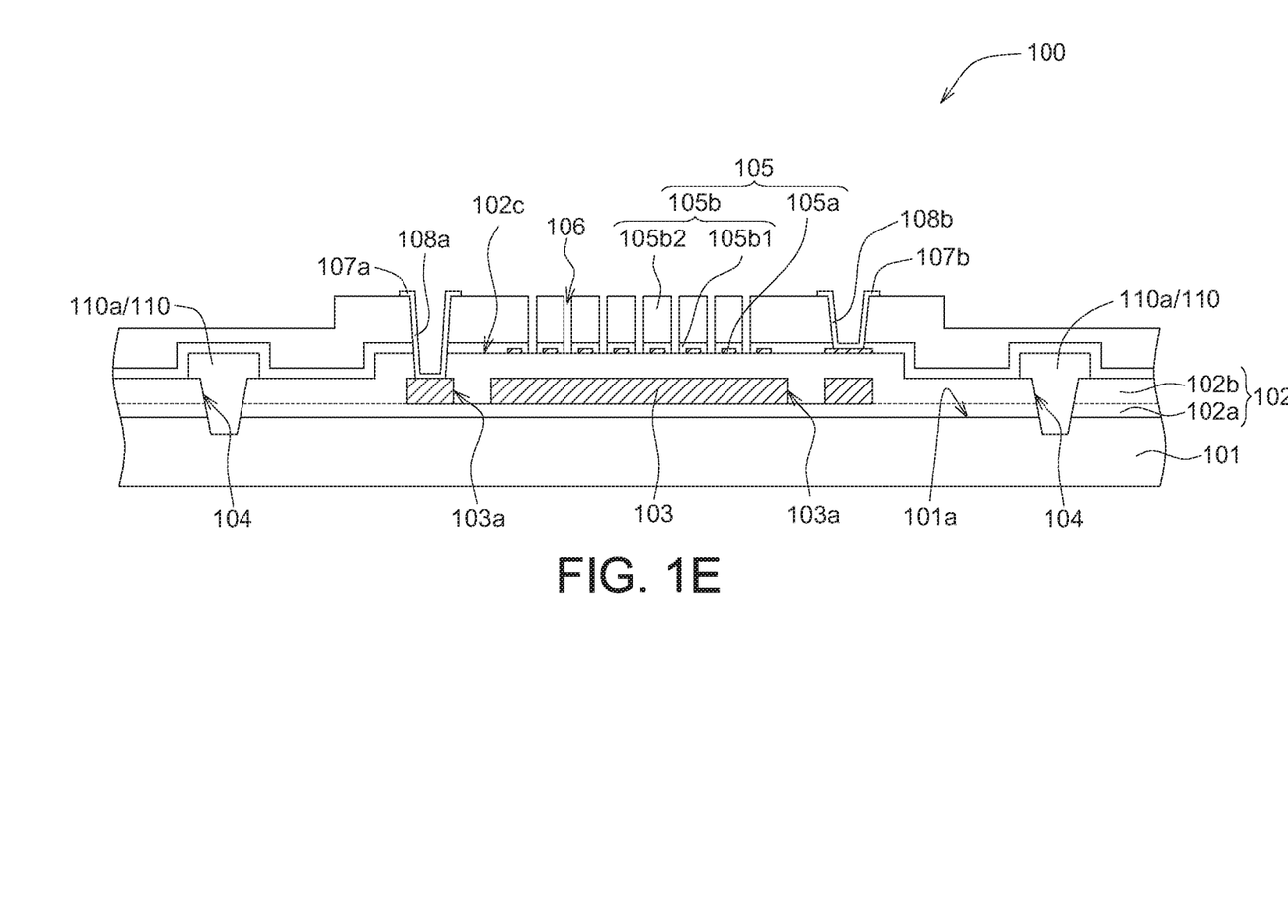

Next, a conductive pad 107a and 107b are respectively formed on the dielectric protection layer 105b; a conductive plug 108a penetrating through the dielectric protection layer 105b and the dielectric layer 102 is formed to connect the membrane 103 with the conductive pad 107a; and a conductive plug 108b penetrating through the conductive layer 105a is formed to connect the conductive pad 107b with the conductive layer 105a (see FIG. 1E). In some embodiment of the present disclosure, the conductive pads 107a and 107b and the conductive plugs 108a and 108b may be formed by a metal interconnection process.

Figure 1F:
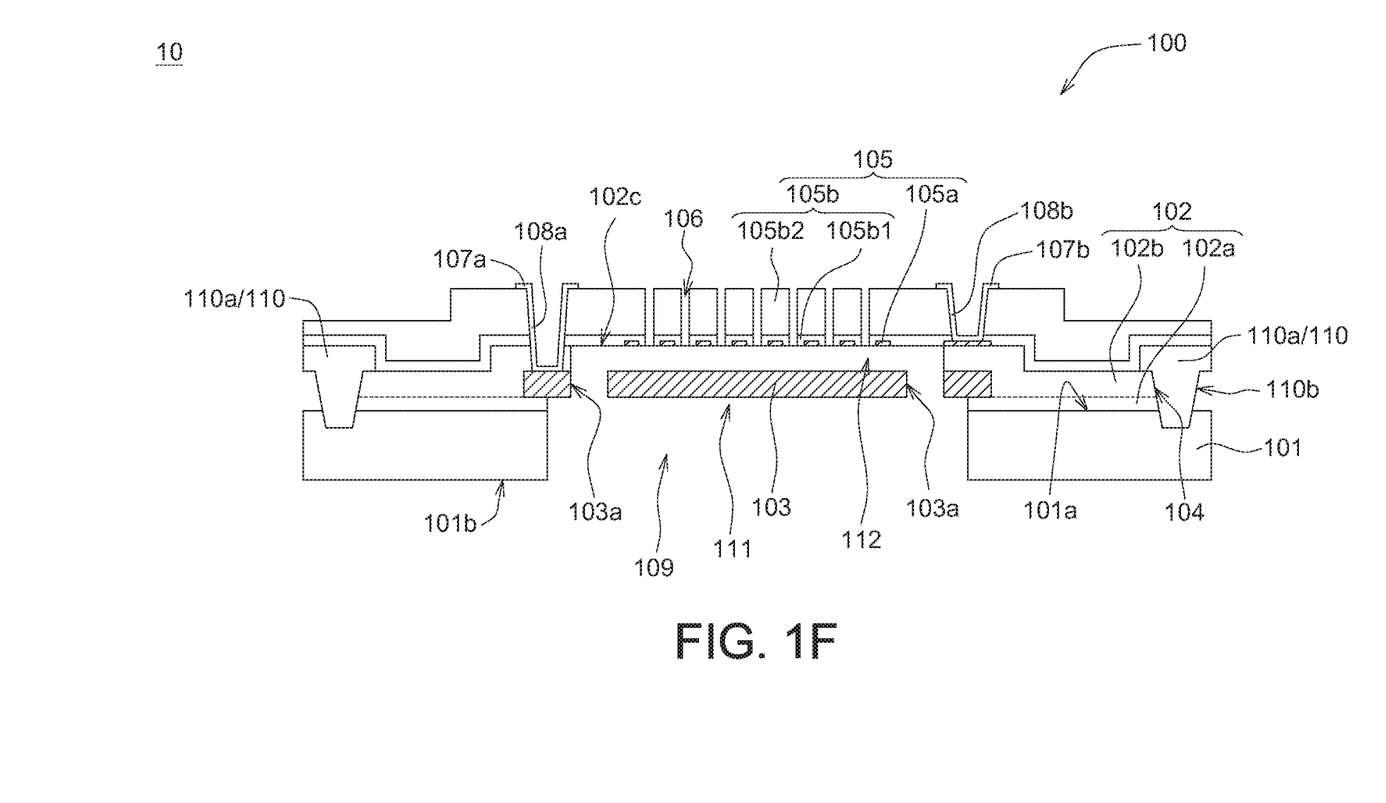

Thereafter, a through-hole 109 is formed in the substrate 101 to expose a portion of the dielectric layer 102. A portion of the dielectric layer 102 is then removed by an etching process (for example, a wet etching process using an etchant containing HF) through the through-hole 109, the penetrating openings 106 and the vent holes 103a, so as to expose a portion of the dielectric layer 102, a portion of the membrane 103 and a portion of the backplate 105 and to form a first chamber 111 between the membrane 103 and the substrate 101 and a second chamber 112 between the membrane 103 and the backplate 105, whereby a MEMS microphone (the semiconductor device 100) is formed on the substrate 101 and surrounded by the protection wall 110.

In detail, after the first chamber 111 and the second chamber 112 are formed, a portion of the membrane 103 is embedded in the dielectric layer 102; the other portion of the membrane 103 and all of the vent holes 103a can be exposed through the first chamber 111 and the second chamber 112. In other words, the first chamber 111 is the space defined by the exposed portions of the dielectric layer 102 and the membrane 103 together with the exposed sidewalls of the substrate 101 via the through-hole 109; the second chamber 112 is the space defined by other exposed portions of the dielectric layer 102, the membrane 103, and the backplate 105; and the first chamber 111 communicates to the second chamber 112 through the vent holes 103a of the membrane 103.

Subsequently, a downstream process, such as a metal damascene process, is performed on the rear surface 101b of the substrate 101 to form metal interconnect structure (not shown) on the rear surface 101b of the device substrate 101 to form a plurality of the MEMSs 10 on the device substrate 101, meanwhile the preparation of the MEMS 10 as shown in FIG. 1F can be implemented after a dicing process cutting along at least one scribe line (not shown) adjacent to the protection wall 110 to separate the MEMSs 10 is performed. Since the portions of the dielectric layer 102 adjacent to the outer surface 110b of the protection wall 110 may be removed by the etching process for forming the first chamber 111 and the second chamber 112, thus (in the present embodiment) the outer surface 110b can be exposed after the dicing process is carried out.

By the support of the protection wall 110, the backplate 105, the membrane 103 and the remaining portions of the dielectric layer 102, that are used to define the first chamber 111 and the second chamber 112 can be kept stable during the etching process. Meanwhile, the poly-silicon layer 110a of the protection wall 110 can properly wrap the MEMS microphone (the semiconductor device 100) to protect the remaining portions of the MEMS microphone from being damaged by the etchant containing HF. Such that, the etching process can not adversely affect the reliability and performance of the MEMS 10.

FIGS. 2A to 2D are cross-sectional views illustrating a series of processing structure for fabricating a MEMS 20 in accordance with another embodiment of the present disclosure. Since, the method for fabricating the MEMS 20 is similar to that for fabricating the MEMS 10 except the process for forming the protection wall 210, thus the identical steps, as depicted in FIGS. 1A to 1B are not redundantly described.

Figure 2A:
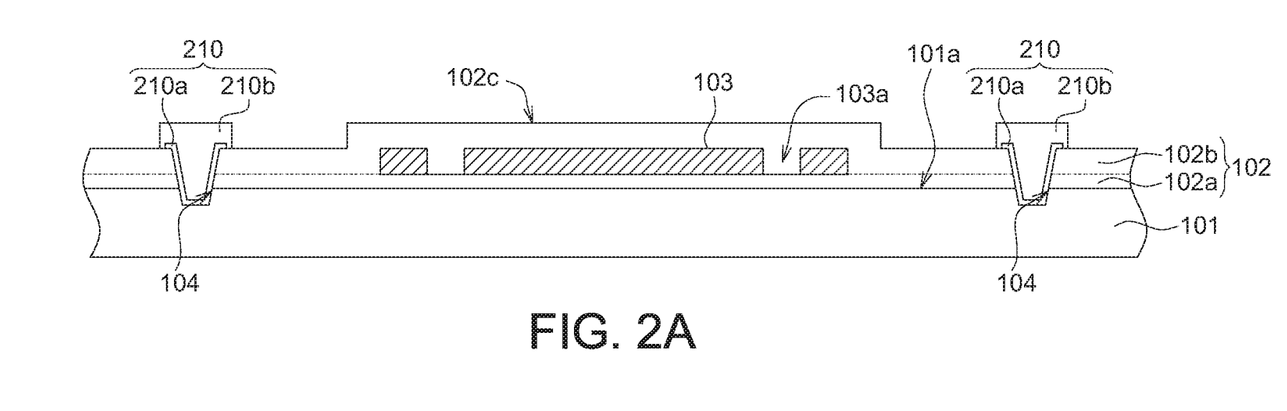
FIGS. 2A to 2D are cross-sectional views illustrating a series of processing structure for fabricating a MEMS in accordance with another embodiment of the present disclosure.

The method for fabricating the MEMS 20 can be continued from the step of forming the protection wall 210, as shown in FIG. 2A. After, a trench 104 surrounding the membrane 103, passing through the second dielectric material layer 102b and the first dielectric material layer 102a to expose a portion of the substrate 101 is formed, a poly-silicon layer 210a is formed at least covering on sidewall of the trench 104.

In the present embodiment, the poly-silicon layer 210a is formed by a CVD process. The poly-silicon layer 210a extends upwards beyond the top surface 102c of the second dielectric material layer 102b and extends downwards directly in contact with the substrate 101, but not fully fill the trench 104. Such that, a hollow poly-silicon ring made by the poly-silicon layer 210a can be formed in the dielectric layer 102.

Next, a silicon nitride layer 210b is formed covering on the poly-silicon layer 210a and filling the trench 104. The combination of the poly-silicon layer 210a and the silicon nitride layer 210b can formed a solid dielectric ring serving as the protection wall 210 surrounding the membrane 103 (see FIG. 2A).

Figure 2B:
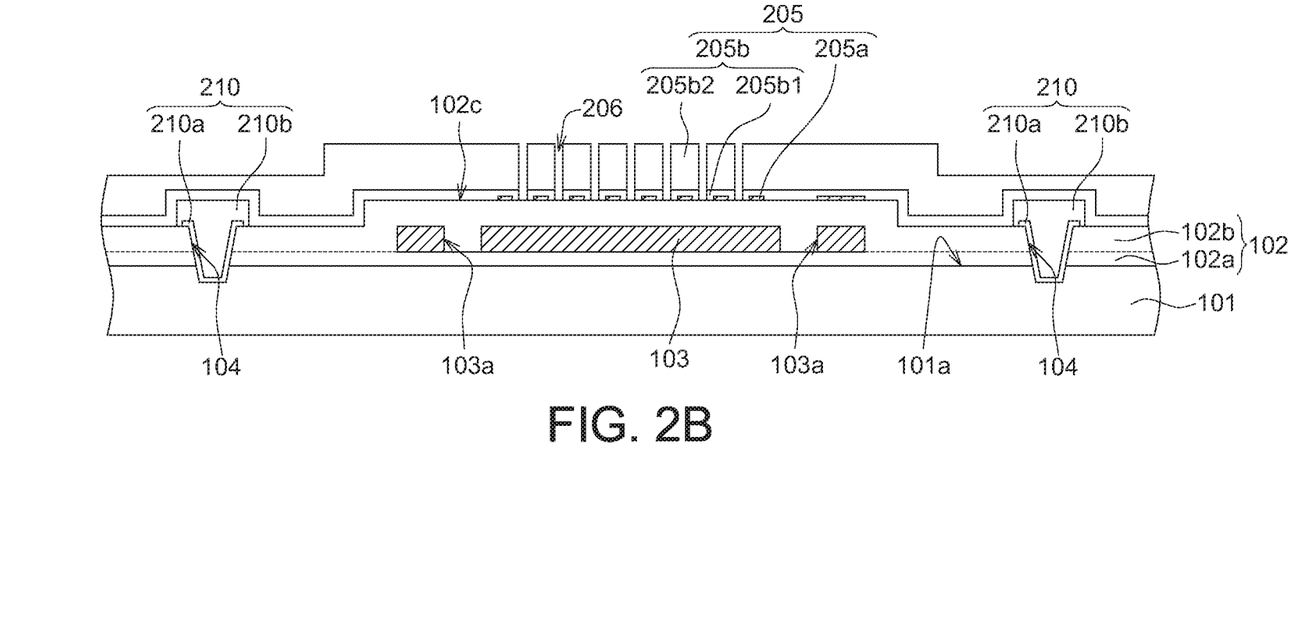

A backplate 205 is then formed on the dielectric layer 102 and the protection wall 210 (see FIG. 2B). Similarly, the backplate 205 includes a conductive layer 205a and a dielectric protection layer 205b (also including a silicon nitride hard mask layer 205b1 and a passive layer 205b2). Since, the structure of the backplate 205 and the forming process thereof, in the present embodiment, are identical to that of the backplate 105 as described above, thus they are not redundantly described again.

Figure 2C:
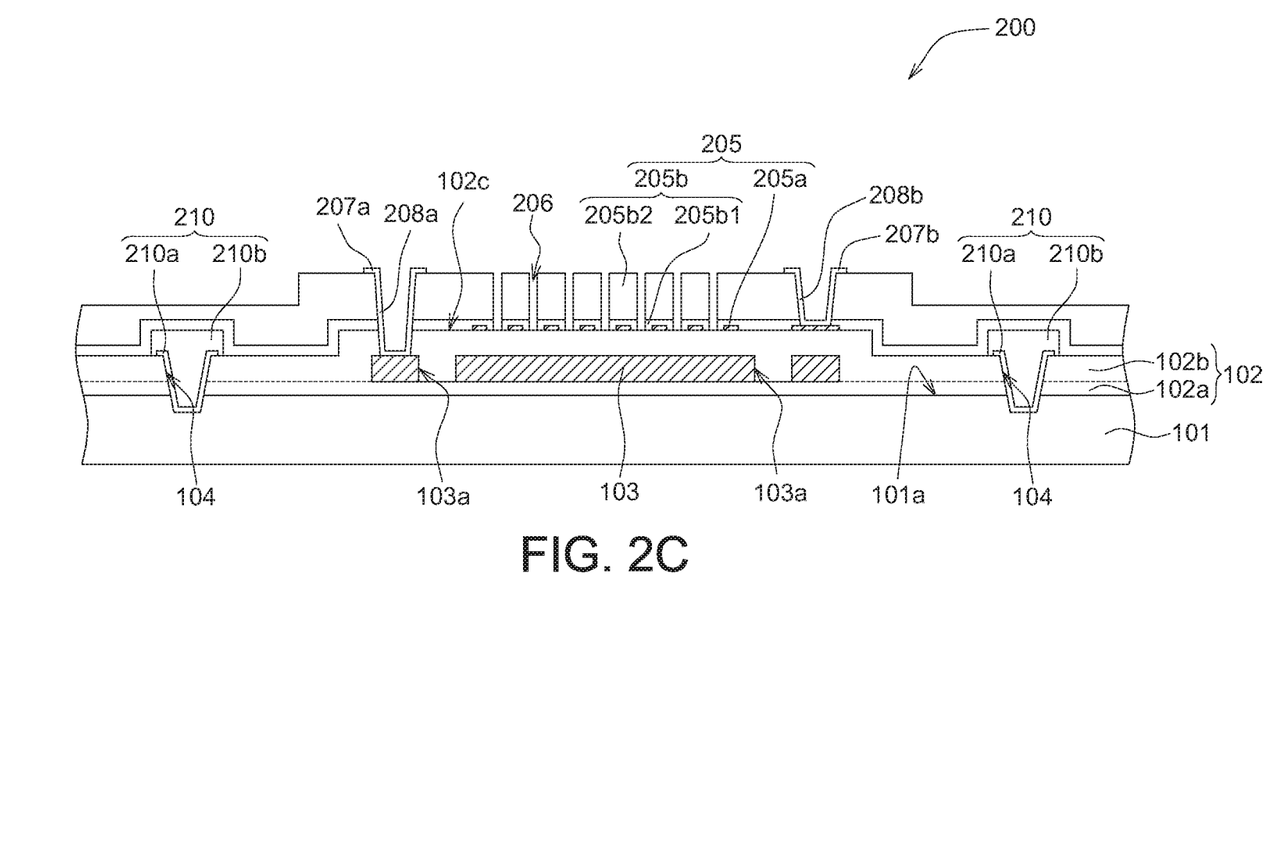

Next, a conductive pad 207a and 207b are respectively formed on the dielectric protection layer 205b; a conductive plug 208a penetrating through the dielectric protection layer 205b and the dielectric layer 202 is formed to connect the membrane 203 with the conductive pad 207a; and a conductive plug 208b penetrating through the conductive layer 105a is formed to connect the conductive pad 207b with the conductive layer 205a (see FIG. 2C). In some embodiment of the present disclosure, the conductive pads 207a and 207b and the conductive plugs 208a and 208b may be formed by a metal interconnection process.

Figure 2D:
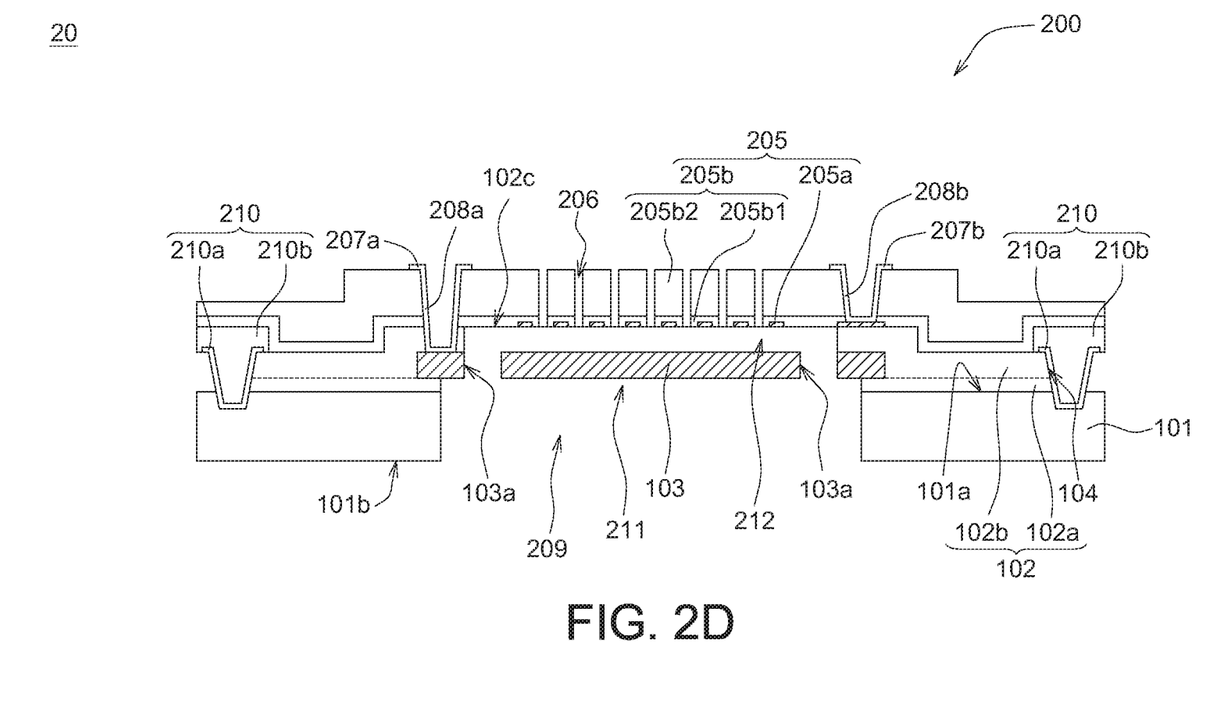

Thereafter, a through-hole 209 is formed in the substrate 101 to expose a portion of the dielectric layer 102. A portion of the dielectric layer 102 is then removed by an etching process (for example, a wet etching process using an etchant containing HF) through the through-hole 209, the penetrating openings 206 and the vent holes 103a, so as to expose a portion of the dielectric layer 102, a portion of the membrane 103 and a portion of the backplate 205 and to form a first chamber 211 between the membrane 103 and the substrate 101 and a second chamber 212 between the membrane 103 and the backplate 205, whereby a MEMS microphone (the semiconductor device 200) is formed on the substrate 101 and surrounded by the protection wall 210.

In detail, after the first chamber 211 and the second chamber 212 are formed, a portion of the membrane 103 is embedded in the dielectric layer 102; the other portion of the membrane 103 and all of the vent holes 103a can be exposed through the first chamber 211 and the second chamber 212. In other words, the first chamber 211 is the space defined by the exposed portions of the dielectric layer 102 and the membrane 103 together with the sidewalls of the substrate 101 exposed via the through-hole 209; the second chamber 212 is the space defined by other exposed portions of the dielectric layer 102, the membrane 103, and the backplate 205; and the first chamber 211 communicates to the second chamber 212 through the vent holes 103a of the membrane 103.

Subsequently, a downstream process, such as a metal damascene process, is performed on the rear surface 101b of the substrate 101 to form metal interconnect structure (not shown) on the rear surface 101b of the device substrate 101, meanwhile the preparation of the MEMS 20 as shown in FIG. 2D can be implemented.

By the support of the protection wall 210, the backplate 205, the membrane 103 and the remaining portions of the dielectric layer 102, that are used to define the first chamber 211 and the second chamber 212 can be kept stable during the etching process. Meanwhile, the poly-silicon layer 210a of the protection wall 210 can properly wrap the MEMS microphone (the semiconductor device 200) to protect the remaining portions of the MEMS microphone from being damaged by the etchant containing HF. Such that, the etching process can not adversely affect the reliability and performance of the MEMS 20.

Figure 3:
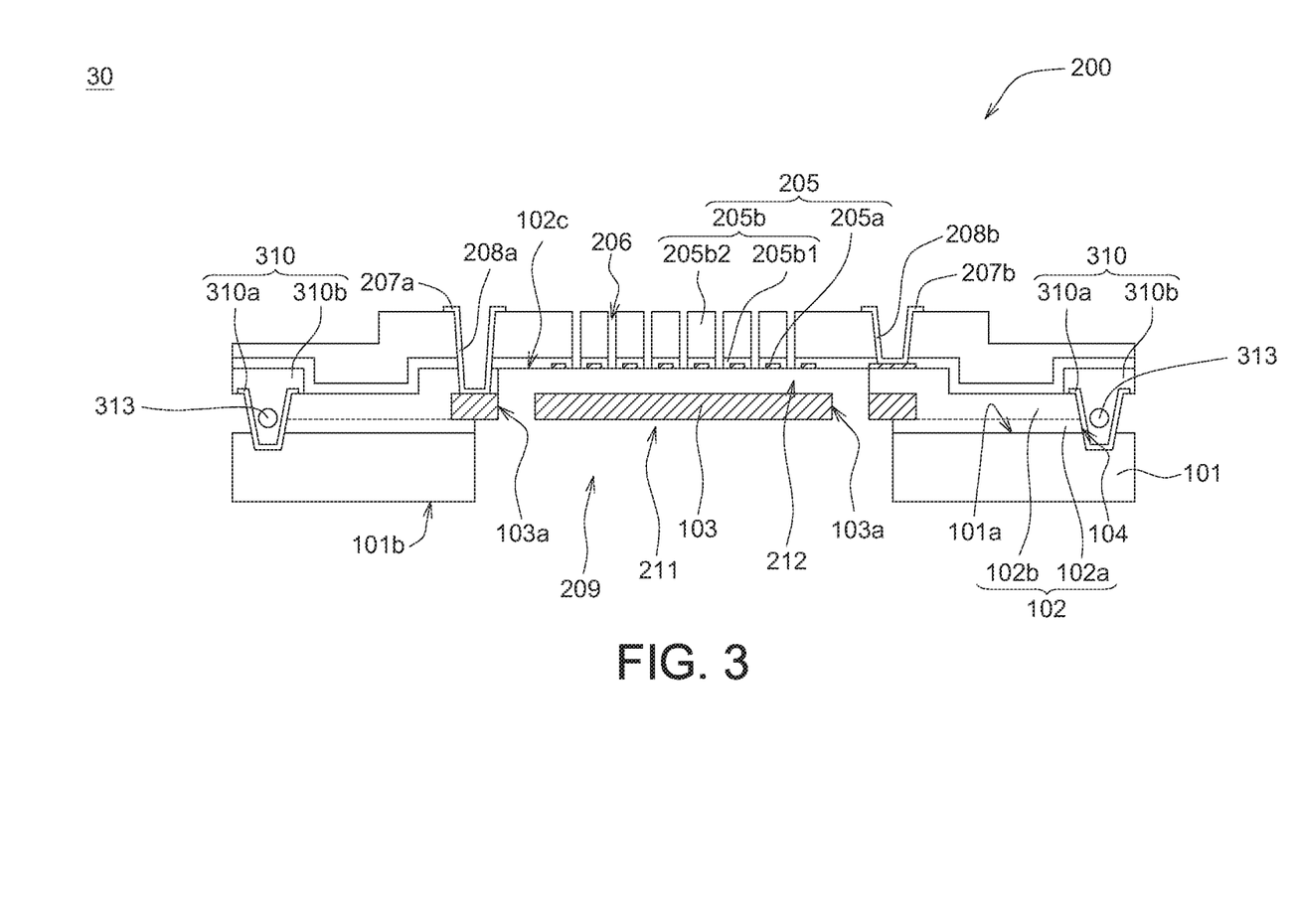
FIG. 3 is a cross-sectional view illustrating a MEMS in accordance with yet another embodiment of the present disclosure.

FIG. 3 is a cross-sectional view illustrating a MEMS 30 in accordance with yet another embodiment of the present disclosure. The structure of the MEMS 30 and the fabricating method thereof are similar to that of the MEMS 20, except that the protection wall 310 (including a poly-silicon layer 310a and a silicon nitride layer 310b) of the MEMS 30 further includes a void 313 formed in the trench 104 and enclosed by the silicon nitride layer 310b.

In the present embodiment, the void 313 may be formed by the process when the silicon nitride layer 310b is formed covering on the poly-silicon layer 310a without fully filling the trench 104. The combination of the poly-silicon layer 310a and the silicon nitride layer 310b can formed a solid dielectric ring serving as the protection wall 310 surrounding the membrane 103.

Figure 4:
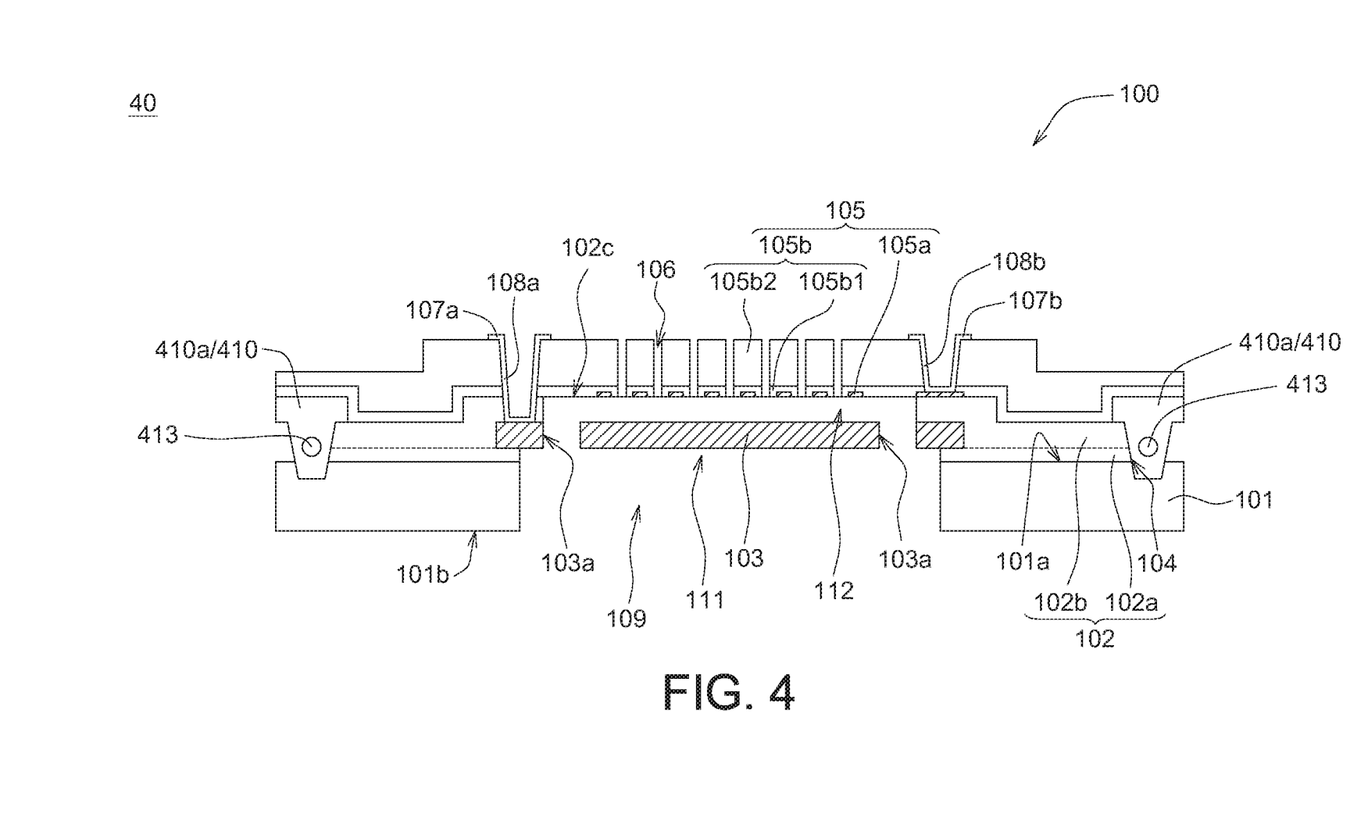
FIG. 4 is a cross-sectional view illustrating a MEMS in accordance with further another embodiment of the present disclosure.

FIG. 4 is a cross-sectional view illustrating a MEMS 40 in accordance with further another embodiment of the present disclosure. The structure of the MEMS 40 and the fabricating method thereof are similar to that of the MEMS 10, except that the protection wall 410 (formed by a poly-silicon layer 410a) of the MEMS 40 further includes a void 413 formed in the trench 104 and enclosed by the poly-silicon layer 410a.

In accordance with the embodiments of the present disclosure, a MEMS and the method for performing the same are provided. The MEMS includes a protection wall having a poly-silicon layer that surrounds a semiconductor device formed in several semiconductor layers. By the support of the protection wall, the structure of the semiconductor device can be kept stable during the etching process of removing portions of the semiconductor layers to form gaps or chambers for accommodating mechanical actuation elements of the semiconductor device. Meanwhile, the poly-silicon layer of the protection wall can properly wrap the semiconductor device to protect it from being damaged by the etching process. Such that, the reliability and performance of the MEMS can be improved.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A micro electromechanical system (MEMS), comprising:
a substrate, having a surface and a rear surface opposite to the surface;
a semiconductor device, disposed on the surface; and
a protection wall having a poly-silicon layer surrounding the semiconductor device and passing through the surface but not electrically contacting to the semiconductor device, wherein there is no electronic element disposed between the surface and the rear surface.

2. The MEMS according to claim 1, wherein the semiconductor device comprises:
a dielectric layer, disposed on the surface;
a membrane, having at least one vent hole or slit, embedded in the dielectric layer; and
a backplate, disposed on the dielectric layer.

3. The MEMS according to claim 2, wherein the substrate has a through-hole passing through the substrate.

4. The MEMS according to claim 3, further comprising:
a first chamber, defined by exposed portions of the membrane and the dielectric layer together with sidewalls of the substrate exposed via the through-hole; and
a second chamber, defined by other exposed portions of the dielectric layer, the membrane, and the backplate, and communicate with the first chamber through the at least one vent hole or slit.

5. The MEMS according to claim 2, wherein the poly-silicon layer fills a trench extending from a top surface of the dielectric layer to the surface of the substrate.

6. The MEMS according to claim 5, further comprising a void formed in the trench and enclosed by the poly-silicon layer.

7. The MEMS according to claim 2, further comprising a dielectric layer covering on the poly-silicon layer, wherein the poly-silicon layer is disposed on a sidewall of a trench extending from a top surface of the dielectric layer to the surface of the substrate.

8. The MEMS according to claim 7, further comprising a void formed in the trench and enclosed by the dielectric layer.

9. The MEMS according to claim 7, wherein the dielectric layer comprises silicon nitride.

10. The MEMS according to claim 1, wherein the protection wall has at least one exposed outer surface.

11. A method for fabricating a MEMS, comprising:
providing a substrate, having a surface and a rear surface opposite to the surface;
forming a semiconductor device on the surface;
forming a protection wall having a poly-silicon layer to make the poly-silicon layer surrounding the semiconductor device and passing through the surface but not electrically contacting to the semiconductor device, wherein there is no electronic element disposed between the surface and the rear surface.

12. The method according to claim 11, wherein prior to forming the protection wall, the forming of the semiconductor device comprises:
forming a first dielectric material layer on the surface;
forming a membrane having at least one vent hole or slit on the first dielectric layer; and
forming a second dielectric material layer on the membrane.

13. The method according to claim 12, wherein after forming the protection wall, the forming of the semiconductor device comprises:
forming a conductive layer on the second dielectric material layer;
forming a dielectric protection layer on the conductive layer;
forming a plurality of penetrating openings passing through the dielectric protection layer and the conductive layer;

forming a through-hole passing through the substrate; and removing portions of the first dielectric material layer and the second dielectric material layer through the through-hole and the at least one vent hole or slit.

14. The method according to claim 12, wherein the forming of the protection wall comprises:

forming a trench surrounding the semiconductor device and passing through the second dielectric material layer and the first dielectric material layer to expose a portion of the substrate; and forming the poly-silicon layer at least covering on a sidewall of the trench.

15. The method according to claim 14, wherein the forming of the protection wall further comprises forming a void enclosed by the poly-silicon layer.

16. The method according to claim 14, wherein the forming of the protection wall further comprises forming a silicon nitride layer and covering on the poly-silicon layer and filling the trench.

17. The method according to claim 16, wherein the forming of the protection wall further comprises forming a void enclosed by the dielectric layer.

18. The method according to claim 14, wherein the trench extends from a top surface of the dielectric layer to the surface of the substrate and exposes the surface there form.

19. The method according to claim 14, wherein the trench passes through the surface of the substrate and expends into the substrate.

20. The method according to claim 14, wherein after the portions of the first dielectric material layer and the second dielectric material layer are removed at least one outer surface of the protection wall is exposed.

* * * * *